(12) United States Patent
Bartlow

(10) Patent No.: US 6,525,423 B2
(45) Date of Patent: Feb. 25, 2003

(54) SEMICONDUCTOR DEVICE PACKAGE AND METHOD OF DIE ATTACH

(75) Inventor: Howard D. Bartlow, Nampa, ID (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 09/884,788

(22) Filed: Jun. 19, 2001

(65) Prior Publication Data

US 2002/0190363 A1 Dec. 19, 2002

(51) Int. Cl.⁷ .......................... H01L 23/48; H01L 29/40
(52) U.S. Cl. ................. 257/737; 257/738; 257/778
(58) Field of Search .................... 257/735, 737, 257/738, 701, 778, 787–789, 795, 712–720; 438/118, 613–617, FOR 343

(56) References Cited

U.S. PATENT DOCUMENTS 5,186,383 A * 2/1993 Melton et al.
6,133,637 A * 10/2000 Hikita et al.
6,303,998 B1 * 10/2001 Murayama

* cited by examiner

*Primary Examiner*—Long Pham
*Assistant Examiner*—Dilinh Nguyen
(74) *Attorney, Agent, or Firm*—Townsend and Townsend and Crew LLP; Henry K. Woodward

(57) ABSTRACT

An inexpensive method of providing uniform and consistent spacing between a semiconductor die and a supporting substrate includes providing relatively rigid spacers such as a plurality of lengths of wires or a plurality of bumps on the mounting surface for the chip. The spacers allow a uniform desired spacing of the die from the supporting substrate when attached by an epoxy.

12 Claims, 2 Drawing Sheets

SEMICONDUCTOR DEVICE PACKAGE AND METHOD OF DIE ATTACH

BACKGROUND OF THE INVENTION

This invention relates generally to semiconductor device packaging, and more particularly the invention relates to the attachment of a semiconductor die to a package using high thermal conductivity epoxy.

Semiconductor integrated circuits and devices are mounted and hermetically sealed within a package. Wire bonds connect the semiconductor chip to electrical leads extending from the package. Typically, the chip is mounted to a surface of the package by a suitable epoxy. Heretofore, an automated dispensing machine places a serpentine pattern of epoxy on the package surface and then the chip is placed in pressure engagement with the epoxy to form a bond.

More recently, a high heat conductivity epoxy such as a metal filled epoxy has been employed to provide greater heat conductivity, especially for power devices. However, it has been discovered that uneven spacing of the bottom surface of the die, which is often metal plated, from the metal surface of the package, can adversely effect both heat dissipation and electrical characteristics. Further, the epoxy thickness can be either too thick or too thin for optimum device performance.

The present invention provides a package and method of die attach which improves both heat dissipation and other characteristics of the packaged device.

BRIEF SUMMARY OF THE INVENTION

In accordance with the invention, solid spacers are provided on the mounting surface of a package before the application of epoxy. Then when the semiconductor die is placed in the package in pressure engagement with the epoxy, the solid spacers provide an accurate registration of the bottom surface of the die to the mounting surface. A precise spacing of the die from the mounting surface is provided and eliminates any tilt of the chip and the surface.

In a preferred embodiment, a plurality of lengths of bonding wire, such as used in electrically connecting the chip to package leads, are laid on the mounting surface as spacers with the ends of the wires preferably bonded to the metal mounting surface to prevent movement. A high heat conductivity epoxy is then applied to the surface and over the wires, and the semiconductor chip is then brought into pressure engagement with the epoxy and with the wires providing stops. The chips are then accurately positioned on the package mounting surface.

The method of die attach in accordance with the invention is consistent and repeatable in providing uniform spacing of dies in packages.

The invention and objects and features thereof will be more readily apparent from the following detailed description and appended claims when taken with the drawings.

DESCRIPTION OF THE ILLUSTRATIVE EMBODIMENTS

Figure 1A:
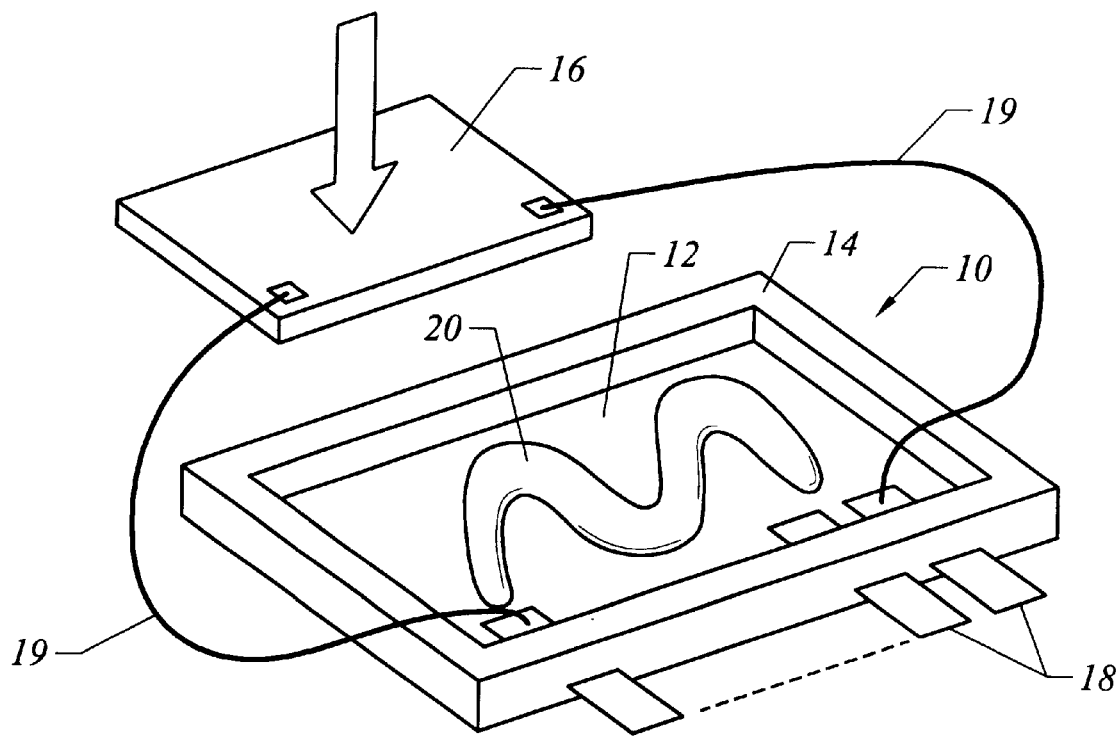
FIGS. 1A, 1B are an exploded perspective view and a side view, respectively, of a prior art semiconductor device structure.
Figure 1B:
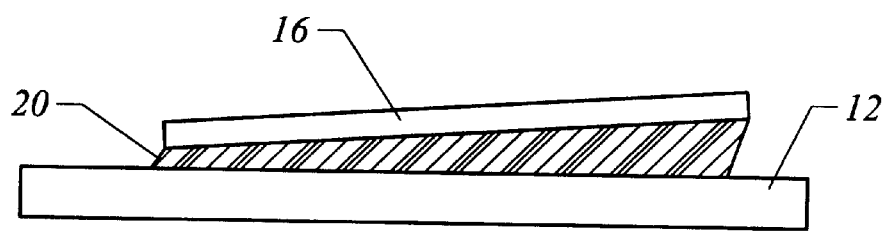

FIG. 1 is an exploded perspective view of a semiconductor die and package structure in accordance with the prior art. The package shown generally at 10 typically includes a bottom surface 12 with raised sidewalls 14 for receiving a package cover (not shown) and sealing a semiconductor die 16 in the package. Package 10 typically has a plurality of leads 18 extending from sides of substrate 12 which are electrically connected to chip 16 by wire bonding as shown at 19 in FIG. 1A. Wire bonding 19 is actually shorter than as illustrated in this exploded view. In microwave circuit applications, substrate 10 can be a ceramic or metal.

In accordance with prior art, chip 16 is mounted on surface 12 by means of an epoxy which is typically applied in a serpentine pattern as shown at 20. Chip 16 is applied to pressure engagement with the epoxy which engages the bottom surface of chip 16, sometimes metal plated, and maintains the chip on surface 12. Registration of chip 16 in pressure engagement is measured from the top surface of chip 16 which often is not uniform in thickness with the bottom metalized surface. Thus, as shown in the side view of FIG. 1B (exaggerated) there can be uneven spacing between chip 16 and the surface 12 of the package.

Recently, a high heat conductivity epoxy has become available for die attach in semiconductor device assembly. The epoxy often has metal, diamond, or carbon particles or carbon fibers, therein to facilitate the transfer of heat from the semiconductor chip to the bottom surface of the package. However, it has been found that more even spacing of the chip bottom surface from the package surface is required to avoid adverse and variable thermal resistance to the semiconductor device and to facilitate heat transfer. Further, it has been found that the spacing distance must be more precise.

In accordance with the invention, a consistent die attach process is provided which is essentially void free, manufacturing tolerant, low cost, and automation friendly. As shown in the exploded perspective view of FIG. 2A, the package structure 10 of FIG. 1A is provided with a relatively rigid spacer (i.e. relative to the epoxy) on the mounting surface 12 for establishing a desired spacing between the chip and the surface 12. In this embodiment, the rigid spacer comprises three lengths of bond wire 22, 24, 26 having a diameter equal to the desired spacing. To prevent movement of the wires on surface 12 prior to die attach, the wires can be bonded to the metal surface 12 of the package. Thus, when chip 16 is placed in pressure engagement with epoxy 20, wires 22, 24, 26 establish a uniform spacing between die 16 and package surface 12. Again, wire bonding 19 interconnects contacts on chip 16 to leads 18.

Figure 2A:
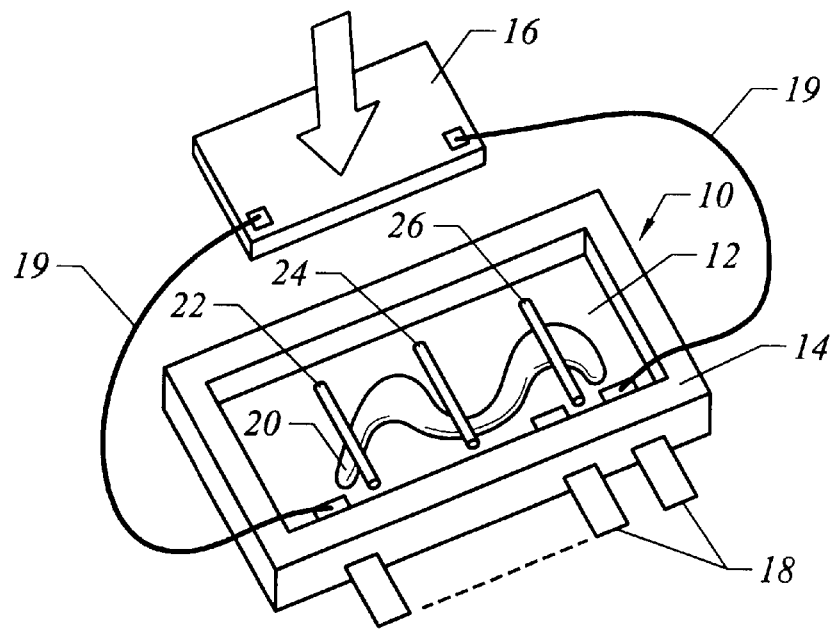
FIGS. 2A, 2B an exploded perspective view and a side view, respectively, of a semiconductor structure in accordance with the invention.
Figure 2B:
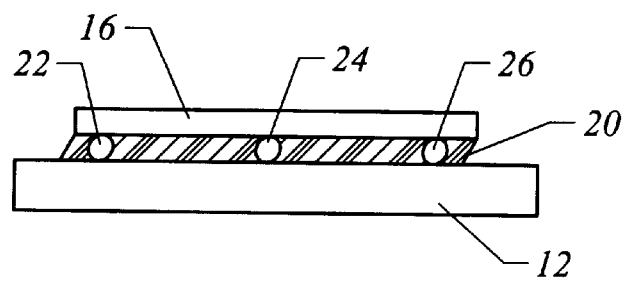

While three wires are illustrated in FIGS. 2A, 2B, it will be appreciated that two or more wires can provide the uniform spacing as determined by the diameter of the wire. Gold wires have been successfully employed, but aluminum or other suitable metal wire can also be employed. A precise length of the wire is not critical in the mounting structure. The semiconductor package can comprise a copper substrate or gold-plated copper or tungsten copper, or other suitable material in practicing the invention. Copper tungsten has less thermal expansion than pure copper, but the epoxy can provide a suitable interface in preventing or minimizing damage from the thermal expansion mismatches.

Figure 3:
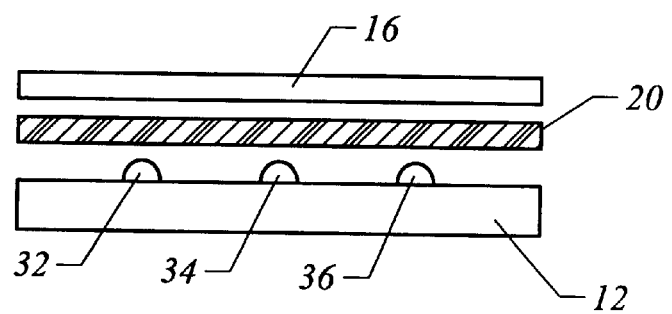
FIGS. 3 is an exploded side view of another embodiment of the invention.

FIG. 3 is an exploded side view in section illustrating another embodiment of the invention in which the package substrate 12 includes a plurality of coined bumps 32, 34, 36 which provide the spacer function. The bumps or stripes are preferably arranged in two or more rows on which the semiconductor chip rests.

The die attach method and resulting semiconductor package in accordance with the invention provides consistent spacing, and is easily automated. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor structure having improved heat dissipation and electrical characteristics comprising:
   a) a semiconductor chip;
   b) a heat dissipating substrate for supporting the semiconductor chip on a surface of the substrate;
   c) a spacer on the surface which provides spacing during manufacture of the structure, the spacer comprising a plurality of wires having a diameter of the desired spacing, and
   d) an adhesive for bonding the chip to the surface with the spacer maintaining a desired precise and uniform spacing between the chip and the surface, the spacer being rigid relative to the adhesive.

2. The semiconductor structure as defined by claim 1 wherein the plurality of wires are bonded to the surface.

3. The semiconductor structure as defined by claim 2 wherein the substrate is part of semiconductor device package.

4. The semiconductor structure as defined by claim 3 wherein the semiconductor device package has leads extending therefrom with wire bonds interconnecting the leads and the semiconductor chip.

5. A semiconductor structure comprising:
   a) a semiconductor chip;
   b) a substrate for supporting the semiconductor chip on a surface of the substrate;
   c) a spacer on the surface, said spacer comprising a plurality of wires having a diameter of the desired spacing, and
   d) an adhesive for bonding the chip to the surface with the spacer maintaining a desired spacing between the chip and the surface, the spacer being rigid relative to the adhesive.

6. The semiconductor structure as defined by claim 5 wherein the plurality of wires are bonded to the surface.

7. The semiconductor structure as defined by claim 6 wherein the substrate is part of semiconductor device package.

8. The semiconductor structure as defined by claim 7 wherein the semiconductor device package has leads extending therefrom with wire bonds interconnecting the leads and the semiconductor chip.

9. The semiconductor structure as defined by claim 5 wherein the adhesive is a high temperature, high conductivity epoxy.

10. The semiconductor structure as defined by claim 9 wherein the epoxy includes particles therein selected from the group consisting of metal, diamond, carbon, and carbon fibers.

11. The semiconductor structure as defined by claim 10 wherein the spacer remains in the structure during curing of the epoxy.

12. The semiconductor structure as defined by claim 5 wherein the spacer remains in the structure during curing of the adhesive.

* * * * *